(12) United States Patent
Korden (10) Patent No.: US 7,804,365 B2
(45) Date of Patent: Sep. 28, 2010

(54) MULTILAYER AMPLIFIER MODULE

(75) Inventor: Christian Korden, Munich (DE)

(73) Assignee: Epcos AG, Munich (DE)

( * ) Notice: Subject to any disclaimer, the term of this patent is extended or adjusted under 35 U.S.C. 154(b) by 12 days.

(21) Appl. No.: 12/266,733

(22) Filed: Nov. 7, 2008

(65) Prior Publication Data

US 2010/0117738 A1    May 13, 2010

(51) Int. Cl.
*H03F 3/14* (2006.01)
(52) U.S. Cl. .................................. 330/307; 330/124 R
(58) Field of Classification Search .................. 330/307, 330/124 R, 295, 51, 302
See application file for complete search history.

(56) References Cited

U.S. PATENT DOCUMENTS 7,498,878 B2 *  3/2009  Lim ........................ 330/124 R
7,554,394 B2 *  6/2009  Maemura ................. 330/124 R
7,605,648 B2 * 10/2009  Yamamoto et al. ............. 330/51

OTHER PUBLICATIONS

Datasheet Dual-band WCDMA PAM: "AWT6224R", Anadigics (Aug. 2008), 8 pages.

Database GSM PAM: "RF3166D", RF Micro Devices, Inc. (2006), 14 pages.

Cripps, S., Chapter 3: Conventional high-Efficiency Amplifier Modes, in *RF Power Amplifiers for Mobile Communications*, Artech House (1999), pp. 45-73.

Cripps, S., Chapter 5: Overdrive and Limiting Effects in RF Power Amplifiers, in *RF Power Amplifiers for Mobile Communications*, Artech House (1999), pp. 113-143.

* cited by examiner

*Primary Examiner*—Henry K Choe
(74) *Attorney, Agent, or Firm*—Fish & Richardson P.C.

(57) ABSTRACT

An amplifier module includes an integrated circuit device including a first amplifier circuit electrically connected to a first input terminal. The amplifier circuit includes a number of x first amplifier branches electrically connected to the first input terminal. The amplifier module also includes a number y of first output terminals each assigned to a respective TX frequency band, a first switching unit that electrically connects one or more of the first amplifier branches to one of the first output terminals, and a multilayer substrate, on top of which the integrated circuit device and the switching unit are mounted. The substrate includes integrated passive matching elements that are part of matching circuits where $x \geq 1$ and $y \geq 2$. Each of the first amplifier branches is adapted to deliver a different power level at its output and is matched to a load at the first output terminals by one of the matching circuits.

18 Claims, 7 Drawing Sheets

MULTILAYER AMPLIFIER MODULE

TECHNICAL FIELD

The present disclosure relates to an amplifier module that can be used in the front-end of a wireless communication unit like a mobile phone.

BACKGROUND

Because the official UMTS standard used in Europe is finding increasing acceptance, there is a corresponding increase in both the need for further frequency bands and the complexity of mobile phones. While the market deals with mobile phones which are able to work in one UMTS band (band 1) and in four GSM bands, the manufacturers are developing mobile phones and data cards adapted to work in three or four WCDMA bands and, at the same time, support GSM/GPRS and EDGE.

Thus, such a mobile phone needs up to six separate power amplifiers for transmitting in these seven or eight different frequency bands. There is also a need for a higher integration of these power amplifiers into one single module in order to save space. At the same time, costs can be reduced, which will be greatly advantageous to manufacturers of mobile phones.

There is a principal difference between power amplifiers which can be used for GSM/GPRS and power amplifiers which can be used for WCDMA (because of their basically different design). As such, in some examples, similar power amplifiers are integrated into one module working in a number of different frequency bands. The fundamental difference between an amplifier for GSM and an amplifier for WCDMA is relates to the different power level for TX signals. The maximum power levels of the amplifiers differ by more than 3 dB. While power amplifiers used for GSM/GPRS work with compression and high efficiency, power amplifiers for EDGE and WCDMA need to amplify signals linearly because the form of these signals has a strong amplitude component. There are also differences in the respective matching to the different modes of amplifying. The impedance of the harmonic waves needs to be very low (harmonic short). In GSM the uneven harmonic waves need to be terminated with high impedance to increase efficiency.

There are already products where two similar power amplifiers used for a multitude of frequency bands are combined in a common housing. In a known product one amplifier each is used to amplify to frequency bands which are adjacent to each other. For example, one power amplifier for GSM 850+GSM 900 is combined with another power amplifier for GSM 1800 and GSM 1900 in a common housing. By this way, a single driving circuit can be used to drive these two power amplifiers which will save costs.

The same kind of integration is used in products where linear power amplifiers for WCDMA signals are combined in a single housing. But a problem is that it is nearly impossible to combine different functional circuits such that they can be used for the different amplifiers.

Another problem arises with linear power amplifiers while working at a reduced power level at the output. Working at a power level backed off from the maximum power level always leads to a reduction of the efficiency of the power amplifier. Thus, waste of energy and waste of battery capacity arise, resulting in reduced handset autonomy. To circumvent these problems, circuits and concepts have been developed for power amplifiers having two or more amplifier stages. There are working-modes where one or more of these power amplifier stages are by-passed or simply switched off. All these alterations, however, have the specific disadvantage of fundamental power losses in amplifier modes of reduced power level. These losses are based on the high capacity of the amplifier stage being recently higher than necessary on the reduced power level mode. Further, a complicated matching is necessary which produces further losses of energy in the circuit. Additional losses in a passive or a switched bypass matching network result from the necessary high impedance transformation ratio, e.g. from 4 ohm to 30 ohm. Further, if load impedance in a low power mode is not optimal additional efficiency reduction arises due to backed-off operation. In a switched bypass, resistive losses of the switch arise.

Typical coefficients of efficiency resulting at those amplifiers are about 40% when working at the highest power level, but reach at maximum a coefficient of 25% while working in medium power mode. This is regarded to be inefficient.

All known integrated amplifier products using the above mentioned bypass structures are working in a narrow band because of a cascaded matching at the power output. Therefore, it is impossible to simultaneously reach a broad-band matching if trying to save energy while bypassing one or more of a multitude of power amplifier stages.

SUMMARY

It is an object of the present disclosure to provide an amplifier module which can work in different frequency bands and which has an increased efficiency while working at a low power level. A further object is to provide an amplifier module having an increased level of integration by using different elements of the amplifier modules commonly for one or more frequency bands simultaneously.

An amplifier module according to the present disclosure provides a power amplifier circuit comprising at least two amplifier branches which are independently matched to a load at the output of the power amplifier circuit. Each branch is separately fed to a switched unit connecting the respective branch to an output terminal assigned to a respective frequency band. The amplifier circuit comprises an integrated circuit device and is connected to the first input terminal. Starting from this input terminal, the amplifier circuit divides at a node into a number of first amplifier branches. The module further comprises first output terminals assigned to respective TX frequency band each. A first switching unit is independently connecting anyone or more of the first amplifier branches to an arbitrary one of the first output terminals. Each of the first amplifier branches is adapted to deliver a different power level at its output and is matched to a load at first output terminals by means of at least one matching circuit each. The amplifier module is based on a multilayer substrate on top of which the integrated circuit device and the switching unit are mounted. Inside of the multilayer substrate there are integrated passive matching elements which are part of a number of matching circuits.

By dividing the power amplifier circuit into at least two amplifier branches for different output power levels which are reconnected at the switching unit, the matching is decoupled and thus matched to an optimized impedance of a load. With this decoupling matching can be made more simply. As matching of a given branch has no impact on another branch it is possible to optimize the band width of the matching to comprise a multitude of adjacent frequency bands. The former limitation of the band width as it is a result of the cascaded matching of the devices known from the art does not exist anymore at the new power amplifier module.

As a specific example, the branch adapted for the lowest power level at its output has a decoupled matching and can reach an efficiency of about 40% always at the maximum rated output power.

Despite additional losses in cause of the insertion loss of the switch unit resulting in a reduction of some percent, the all about efficiency is substantially increased because this reduction is more than compensated by the improved efficiency at low power levels. In some examples, the power amplifier module helps to save a lot of energy in the mobile phone by using the amplifier module for WCDMA bands where a low or a medium power level mode is most frequently used.

The amplifier module can have a single input terminal which can be connected to an RF-IC (transceiver IC) to receive RF signals within the bandwidth of the power amplifier branches. The module can thus be used for all frequency bands of mobile communication whose signals are within this bandwidth. Thus, reduced impact on the bandwidth of the amplifier results and the number of frequency bands which can be connected to the output terminals is increased.

In some examples, the amplifier module can comprise a second input terminal and, connected thereto, a second amplifier circuit, second matching circuits, and a second switching unit, the components arranged and circuited similar to those connected to the first input terminal. With this second input terminal it is possible to drive the amplifier module in a second range of frequencies according to a second number of frequency bands that are used for different mobile communication systems. The number of amplifier branches as well as the number of output terminals can be the same as or can differ from those being connected to the first input terminal. Each of the second amplifier branches is adapted to deliver a different power level at its output, thereby being matched to a load at the second output terminal by means of a second matching circuit.

First and second amplifier circuit can independently be formed in a semiconductor device. In some examples, both amplifier circuits are realized in the same semiconductor device. First and second matching circuits are adapted to match each branch of a respective amplifier circuit to the same common output impedance at each of the output terminals.

In some examples, the matching circuit is connected and circuited between the amplifier circuit and the switching unit. Another matching circuit may be connected between the switching unit and a respective output terminal.

Any of the matching circuits can comprise a first matching element integrated into the multilayer substrate. Other matching elements can be realized similarly or as a discrete passive element mounted on top of the substrate. Other matching elements can be realized in the substrate of the integrated circuit device comprising first and second amplifier circuit.

The switching unit can also be formed in a semiconductor device. In some examples, the switching unit comprises a MEMS (=micro electro mechanical system) device. Such a MEMS device has two electrodes, at least one of them being moveable to or away from the other electrode to close or open an electrical contact thereby forming a switching element. Such a MEMS device can be driven by a piezoelectric force, by electrostatic force or by electromagnetic force for example.

In some examples, the switching unit is an array of a multitude of single switches. This array of switches forms a switch of the type xPyT where x represents the number of branches connected to the switching unit and y represents the number of output terminals connected to the respective switching unit.

Each switching unit can comprise a level switch to select an amplifier branch having a desired power level and a band switch to select an output terminal assigned to a respective frequency band. Thus, in a given switching state at least one level switch and one band switch are connected in series which can be done by connecting both switches to a common connection point. It is also possible to connect two or more amplifier branches being connected to the same input terminal to the same desired output terminal assigned to a frequency band. By connecting two of such amplifier branches in parallel to the same output terminal, the power levels of the two amplifier branches add to each other such that third power level results.

In some examples, the switching unit can be formed in a semiconductor substrate. Furthermore, means for driving the amplifier circuit as well as a logical circuit can be integrated into the substrate of the switching unit.

A semiconductor substrate in which the switching unit is formed can further comprise a voltage regulator to deliver different BIAS voltages or currents to the amplifier circuit. The different BIAS states of the transistors can be directly changed. These voltage levels can be used for switching a respective amplifier branch from an on-state to an off-state or vice versa. The voltage transformer can further be used for all semiconductor or MEMS devices requiring a specific voltage level different from a given supply voltage.

In an amplifier circuit each amplifier branch can comprise a number of amplifier stages. Any two amplifier branches of the same amplifier circuit may have the same or a different number of stages. Each of the amplifier stages comprises a semiconductor element of the same technology.

An amplifier stage and thus, an amplifier circuit may comprise transistors made of a Gallium Arsenide based semiconductor. For example, an amplifier circuit comprises a hetero bipolar transistor of Gallium Arsenide (GaAs HBT). The switching unit, as far as comprising semiconductor switches, is usually based on pHEMT on a Gallium Arsenide or Gallium Nitride substrate or comprises PMOS transistors on a substrate comprising silicon like bulk silicon, SOI (silicon on isolator), SiGe (silicon germanium) or SOS (silicon on sapphire).

In manufacturing a switching unit it is especially advantageous to use processes which are compatible to CMOS processes on a silicon substrate with a high isolation resistance, on an SOI- or an SOS (silicon on sapphire), these substrates allowing it to integrate very complex logic circuits which can be used for driving the switching unit. Those circuits need very small space on the substrate. With those substrates, it is possible to further integrate a bus controller into this substrate if the driving logic comprises a bus. In all cases it is possible to integrate most of the BIAS generating circuits and the driving and logical circuits of the power amplifier circuit within the semiconductor substrate of the switching unit.

It is possible to combine and fully integrate the amplifier circuit(s) and the switching unit into one semiconductor chip.

To avoid a too complex processing of such a fully integrated semiconductor chip, it is possible to manufacture the power amplifier circuit in a gallium arsenide HBT technology, to integrate a matching circuit into the multilayer substrate, and to manufacture the switching unit in CMOS on SOI or on SOS. This way a suitable technology can be used which is optimized for the respective function block and allows to minimize the costs of manufacturing.

The multilayer substrate can comprise one of HTCC (high temperature co-fired ceramic), LTCC (low temperature co-fired ceramic), or a laminated board made from different layers comprising an organic dielectric. Inside the multilayer substrate passive elements are integrated manufactured by structuring metallic layers, conductors and sections of conductor being arranged between any two of the dielectric layers of a ceramic or a laminate. The passive elements can comprise conductor lines, transmission lines, capacitors formed by, for example, two metallic layers opposing each other in different planes of the multilayer substrate, inductors made of inductive conductor lines or coils formed by accordingly structured conductor lines and through contacts in different planes of the multilayer substrate.

The amplifier module is designed to comprise a multitude of output terminals assigned to different frequency bands especially for frequency bands of WCDMA wireless communication systems. The amplifier module can comprise at least five different output terminals assigned to five different frequency bands. The number of output terminals can be enhanced by using further input terminals delivering signals according to a frequency range different from the frequency range of the branches connected to the first input terminal. As every output terminal may be connected to a respective matching circuit, a perfect matching to a load being connected to the output terminal at each of the output terminals results.

The amplifier module according to the present disclosure may comprise a multitude of components with each of the components being a chip based on a semiconductor substrate carrying the integrated circuit, switching elements, or discrete passive components. All these components may be mounted on the multilayer substrate and covered by an insulating or protecting cover. This cover may comprise a mold deposited over the multilayer substrate and the components being mounted or integrated therein or thereon. The cover may be insulated to the components and may further comprise a metallic sheet. This can be used to shield the module electromagnetically. It is also possible to protect single components of the module by covering same with a glob top.

DETAILED DESCRIPTION

Figure 1:
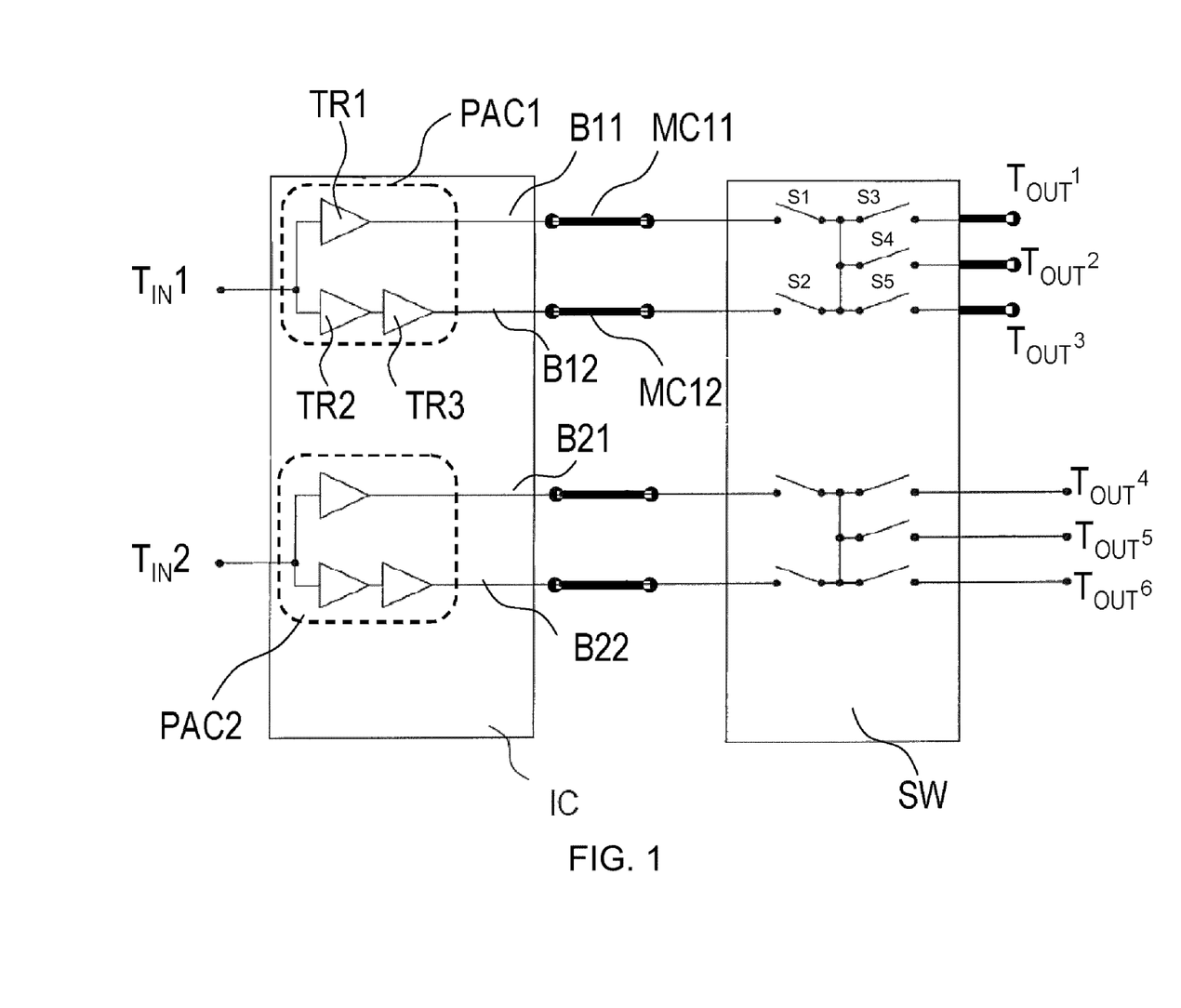
FIG. 1 shows schematically an amplifier module connected to two input terminals.

FIG. 1 shows an example of the power amplifier module in a schematic view. The module comprises an integrated circuit IC formed on a first chip and a switching unit SW formed on a second chip. A first input terminal TIN1 is connected with the first power amplifier circuit PAC1 on the first chip. A second input terminal TIN2 is connected to a second power amplifier circuit PAC2 on the same chip. The first power amplifier circuit PAC1 comprises two branches, each branch being connected to a matching circuit MC11, MC12. The first branch B11 comprises a first amplifier stage TR1 while the second branch B12 comprises a second and a third amplifier stage TR2, TR3, each amplifier stage being implemented in the power amplifier circuit on the first chip IC.

Every branch is separately circuited or connected to the switching unit SW adapted to make a connection of the respective branch with a respective output terminal TOUT1 to TOUT3. In this example, the switching unit connected to first and second branch comprises five different switching elements S1 to S5. Each connection of a branch to a respective output terminal needs a series connection of two switching elements, one of them being a level switch S1, S2 and the other one being a band switch S3, S4, S5. In the figure all switching elements are open. By connecting one branch to one output terminal, the amplifier stages of the respective branch amplify a signal connected to a first input terminal TIN1 to a first power level and, by the respective position of the two series connected switching elements, feed the amplified signal to the respective output terminal TOUT. By connecting another branch of the power amplifier circuit to the respective output terminal, another one or another set of amplifier stages amplify the respective input signal to a respective second power level different from the first power level and deliver the amplified signal to an output terminal by a respective switching position of the switching unit. It is also possible to connect in parallel two or more branches of the power amplifier circuit to the same output terminal. In this case, all amplifier stages of the two branches connected or circuited in parallel add their power level such at a third power level being the sum of first and second power level is applied to the respective output terminal.

The module of FIG. 1 comprises a second input terminal TIN2, a second power amplifier circuit PAC2, further matching circuits and a further array of switching elements connectable to another set of output terminals TOUT4 to TOUT6. All elements and connections are similar to those used in a first and second branch connected to the first input terminal as described above. Especially different is the respective matching circuit in a respective branch which may be circuited between power amplifier and switching unit. This is due to the different frequency ranges of the signals connected to the different input terminals requiring a different matching because of the frequency dependent impedance of signals in each of the branches.

Figure 2:
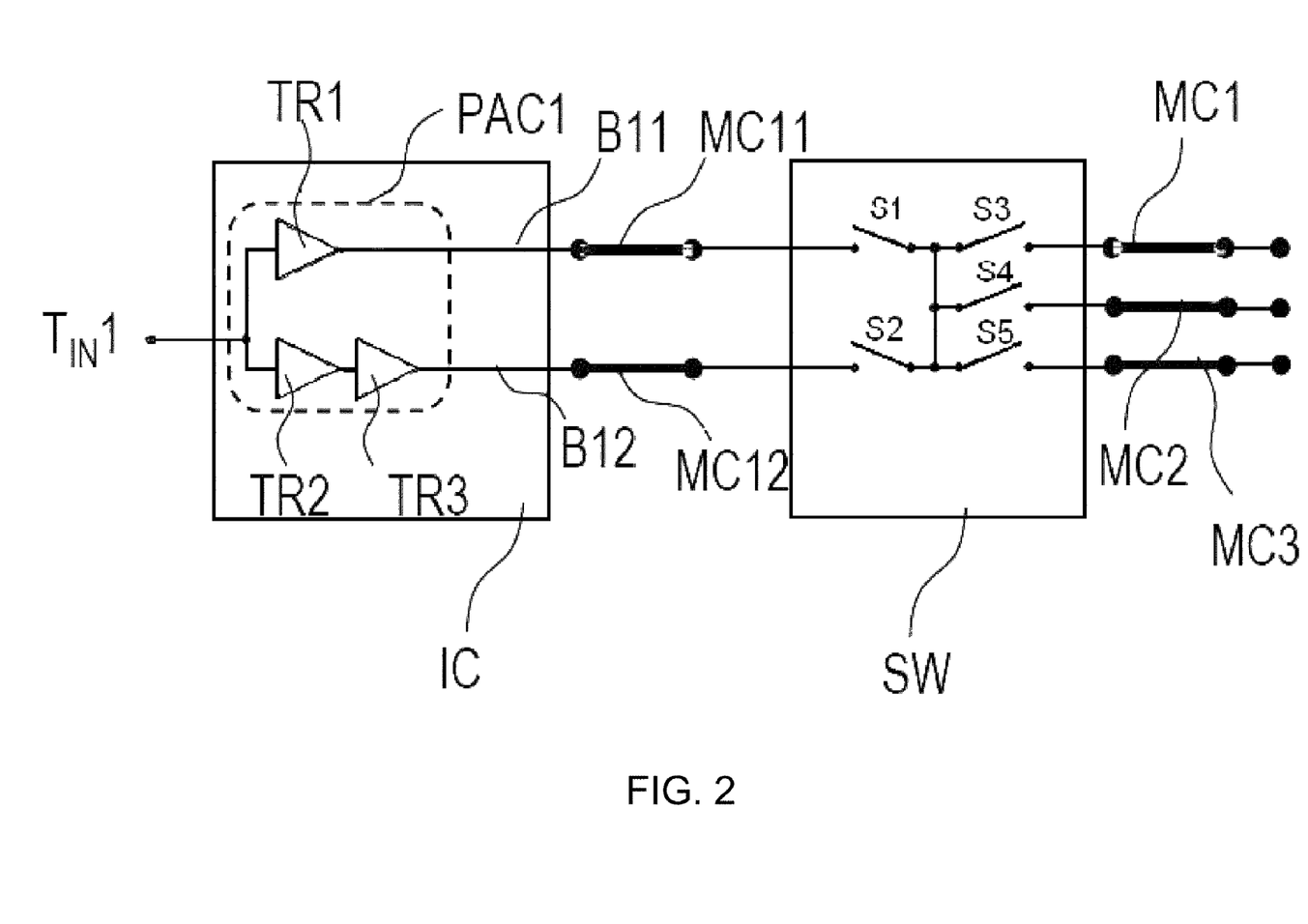
FIG. 2 shows an amplifier module using two sets of matching circuits.

FIG. 2 shows a section of the above amplifier module in a schematic view. Shown are a first and second branch B11, B12 connected to a first input terminal, first matching circuits MC11, MC12 and a switching unit SW comprising an array of switching elements S1 to S5. By the switching unit SW, each of the branches can be independently connected to one of the output terminals TOUT1 to TOUT3. Further matching circuits MC1, MC2, MC3 are circuited between the respective output terminal and the switching unit to improve the matching.

Starting from an example such as those depicted in FIG. 1 or 2, it is possible to modify the amplifier circuit to include a greater number of branches, each comprising amplifier stages especially based on transistors, each delivering a specific power level for feeding the amplified signal by means of the switching unit to a number of output terminals, wherein the number of output terminals may be exceed the number of three like shown in FIG. 1 or 2.

Figure 3:
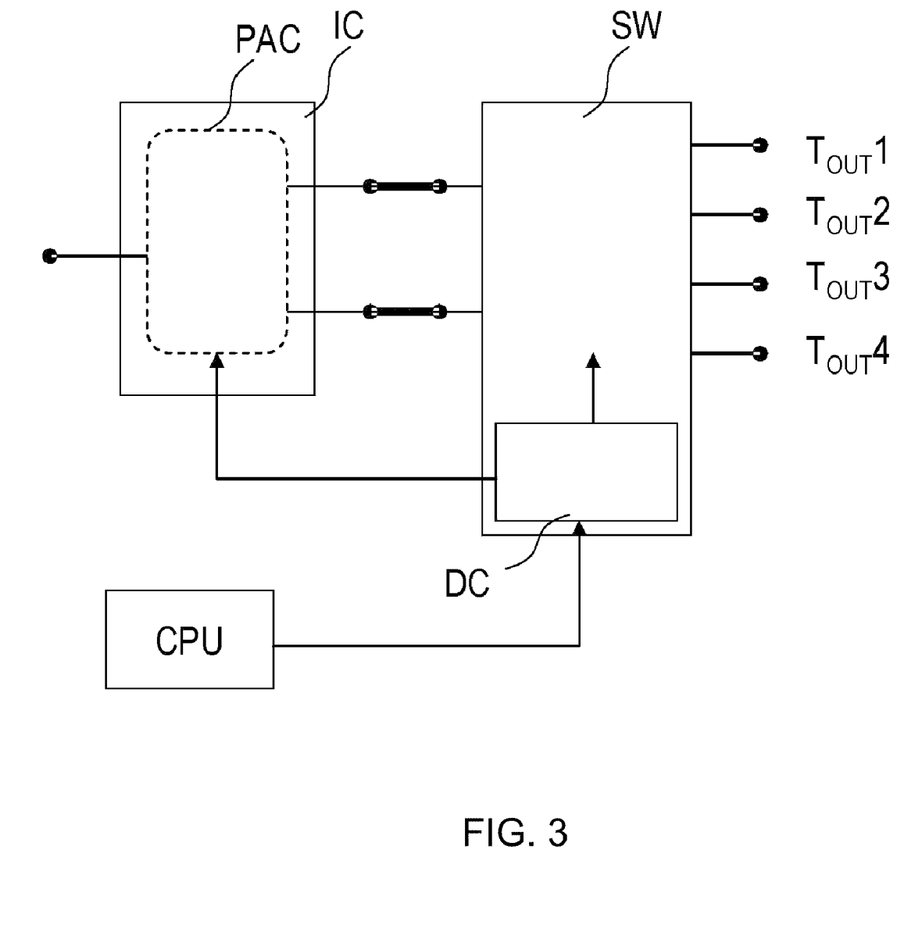
FIG. 3 shows an amplifier module comprising a driving circuit integrated into the switching unit.

FIG. 3 is a schematic that further illustrates components of the amplifier module. Integrated into the semiconductor chip of the switching unit SW is a driving circuit DC adapted to drive the power amplifier circuit PAC. A central processing unit CPU which may be separate from the power amplifier module controls the driver circuit, which, dependent on the control signals sent by the CPU, renders the amplifier stages to be in an on-state or in an off-state. Moreover, the driving circuit delivers different BIAS voltages or currents to the power amplifier circuit to result in a desired amplifying factor. The driving circuit DC may be further adapted to drive the switching unit SW and to open or close the switching elements of the switching unit.

Figure 4:
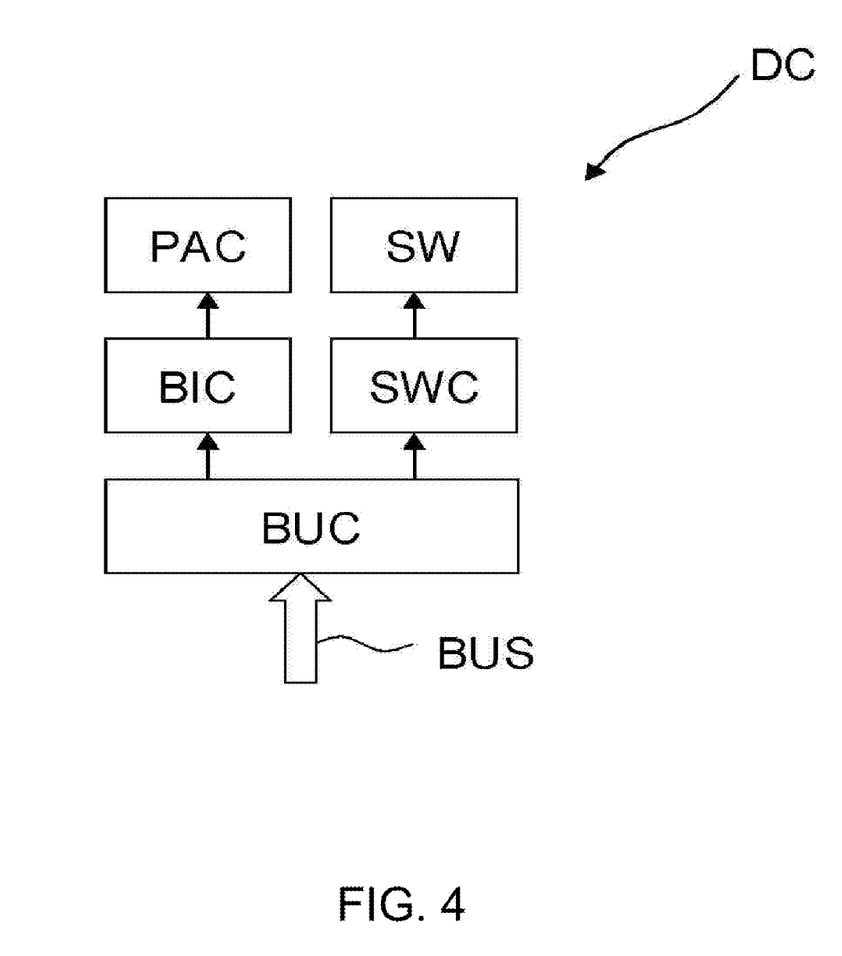
FIG. 4 schematically shows the connection of driving circuits, amplifier circuit, and switching unit.

FIG. 4 shows the signal flow if a bus BUS is used to drive the switching unit as well as the power amplifier circuit. The bus delivers signals from the central processing unit CPU to a bus controller BUC being a first logical circuit. The bus controller translates the bus signals and possibly decodes same. Decoded signals are sent to two further circuits, namely a BIAS control BIC and a switch control SWC which can both be implemented into the substrate of the integrated circuit IC. The BIAS controller controls and drives the power amplifier circuit while the switch controller controls and drives the switching unit SW. In some examples, all those BIAS components are integrated in one and the same semiconductor substrate of the switching unit SW.

Figure 5:
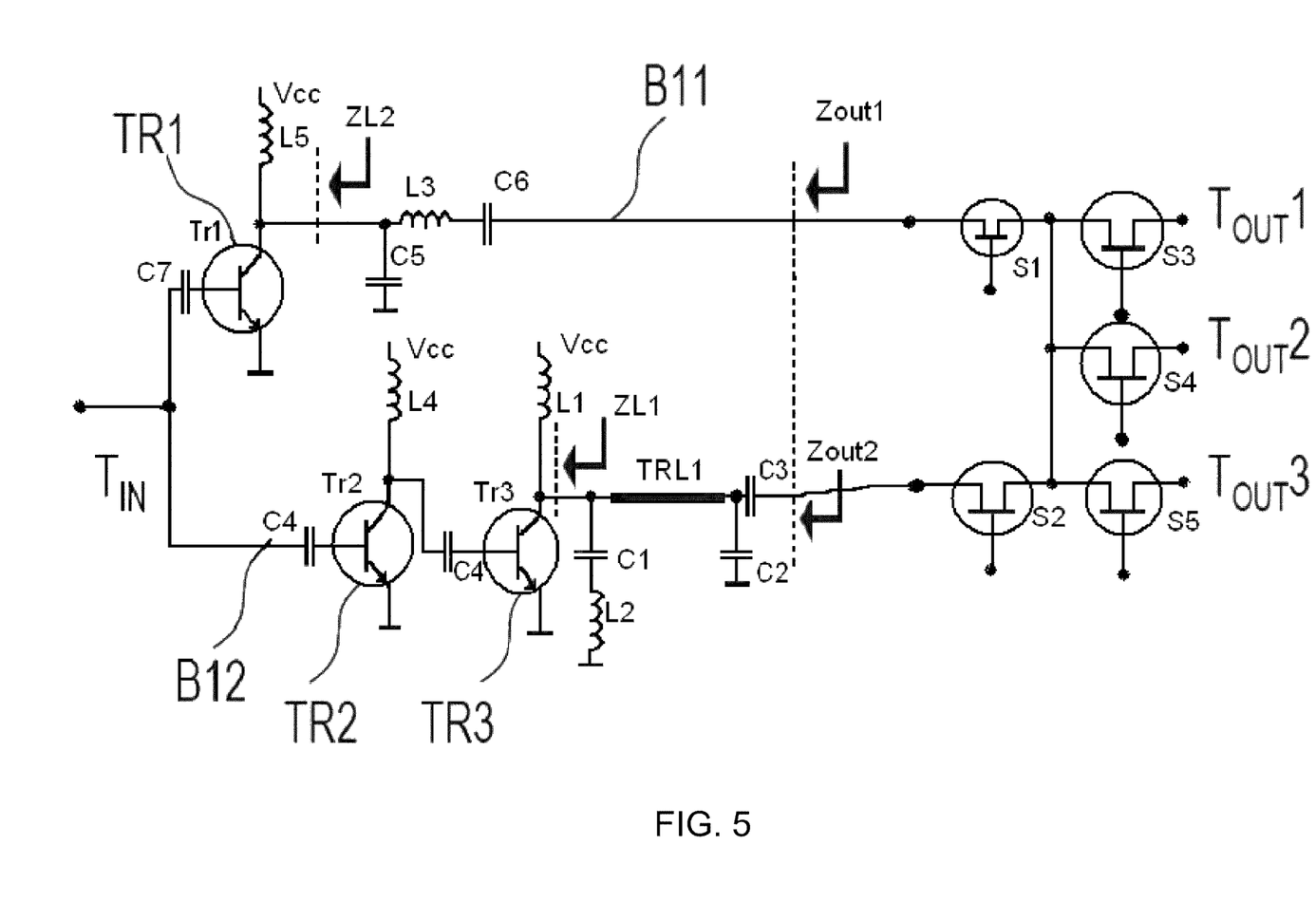
FIG. 5 shows an example of an amplifier circuit and according matching circuits.

FIG. 5 is a schematic that illustrates a possible realization of the module depicted more generally in FIG. 2. Starting from an input terminal TIN, the signal branches into a first amplifier branch B11 and a second amplifier branch B12. A capacitor C at the beginning of each branch decouples the circuit from DC signals. In the first branch B11 a first amplifier stage is formed by a first transistor TR1. At the output of the first amplifier stage TR1 the branch has impedance ZL2. In the second branch B12 a second amplifier stage formed by a second transistor TR2, a further capacitor C4, and a third amplifier stage formed by a third transistor TR3 are circuited in series. Behind the third amplifier stage, the impedance in this branch is ZL1. Normally, ZL1 differs from ZL2 and both impedances are not matched to the load connected to the output terminal (e.g., ZL1 is smaller than ZL2). Thus, impedance matching circuits are arranged in each of the branches.

The first matching circuit in the first branch B11 comprises a capacitor C5 connected in parallel to the branch. A series inductor L3 and a series capacitor C6 follows. At this point, the first branch B11 has output impedance Z0ut1. In the second branch B12 the first matching circuit MC is formed by a capacitor C1 and an inductor L2 connected in series and arranged in a shunt line to ground. In the series branch a transmission line TRL1 which is followed by another shunt line wherein a second capacitor C2 is arranged. In the series, a third capacitor C3 is the last matching element. At this point, the second branch has an output impedance of Z0ut2. In some examples Z0ut1=Z0ut2.

The switching unit SW comprises five independent switches which allow by a series connection of one of the level switches S1 and S2 and one of the band switches S3 to S5 to connect each of the branches B11, B12 independently to a desired output terminal T0ut. If the level switches S1 and S2 are closed at the same time, it is possible to feed first and second branch to a desired output terminal T0ut.

Figure 6:
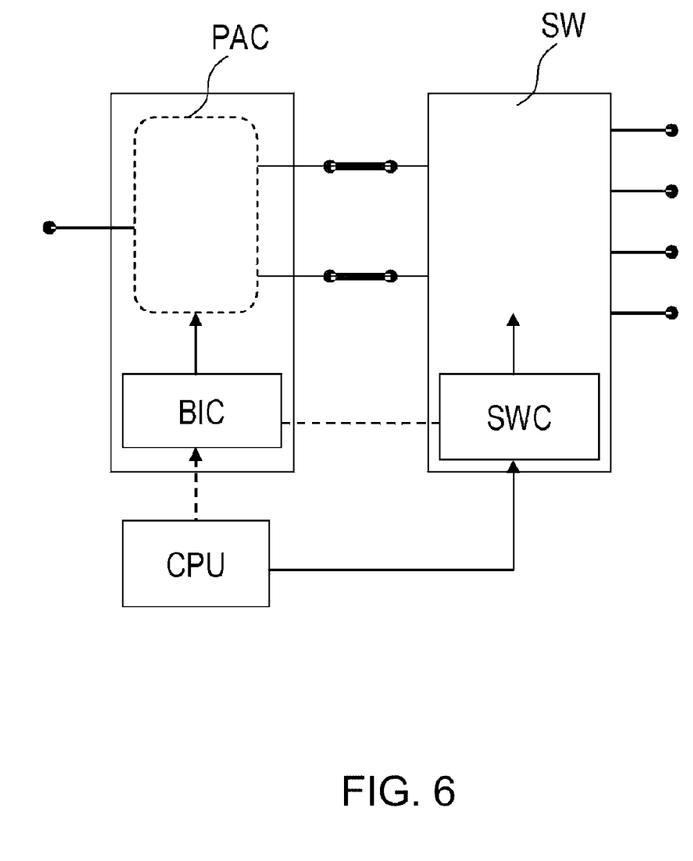
FIG. 6 shows an amplifier module with logic circuits integrated on different chips.

FIG. 6 shows an example using a different mode of integration. Into the semiconductor substrate of the integrated circuit comprising the power amplifier circuit PAC a BIAS controller BIC is integrated. Into the semiconductor substrate wherein the switching unit SW is realized, a switch controller SWC is integrated. Controlling signals generated by a central processing unit CPU may be sent to the switch controller and the BIAS controller separately. In another mode it is possible that only the switch controller SWC is connected to the central processing unit CPU and the BIAS controller BIC receives driving signals from the switch control SWC. These different possibilities are depicted by respective broken lines in the figure.

Figure 7:
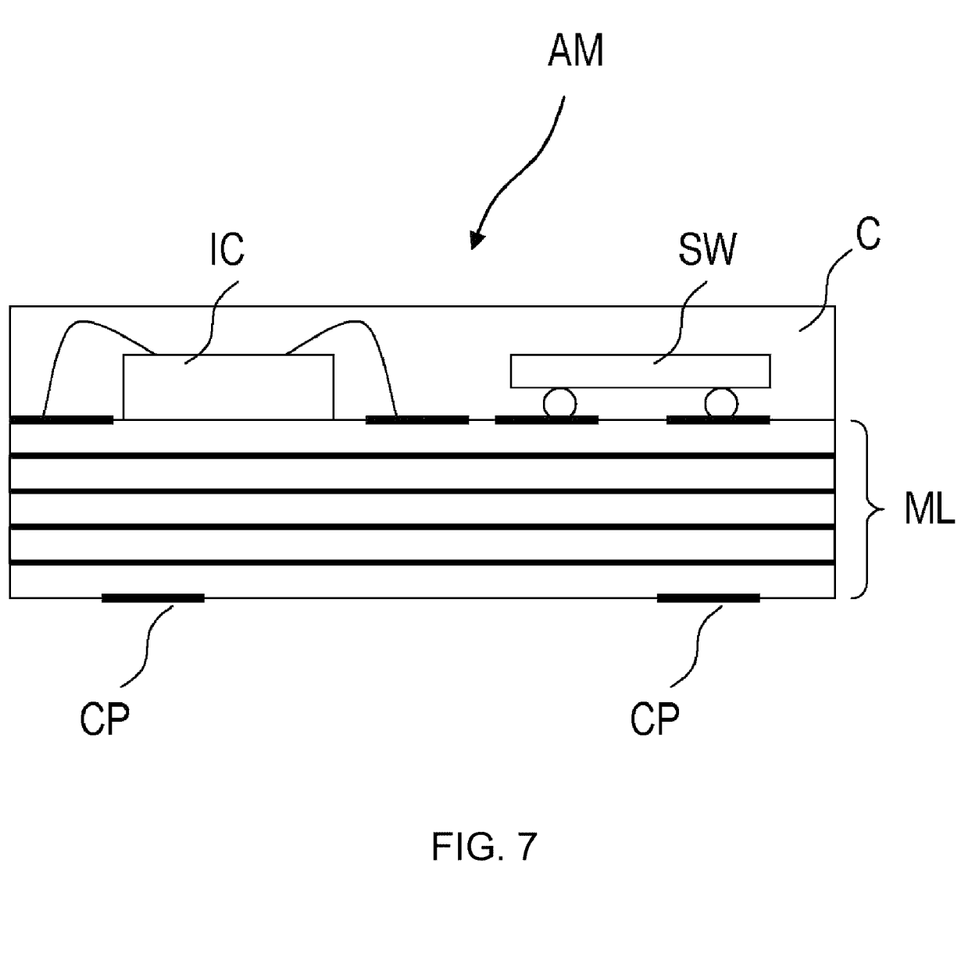
FIG. 7 shows a schematic sectional view through a multilayer substrate of a power amplifier module.

FIG. 7 shows a schematic cross section through a multilayer substrate, and an integrated circuit IC as well as a switching unit SW mounted on the top of the multilayer ML. In this embodiment the integrated circuit IC comprising the power amplifier circuit is mounted with its back side directly on top of the uppermost layer of the multilayer circuit, for example by using an adhesive. The electrical connections to respective pads on top of the multilayer ML are made by bond wires. The semiconductor substrate including the switching unit SW may be mounted by flip chip technology face down to the uppermost layer of the multilayer substrate ML. Mechanical and electrical connections of switching unit SW and multilayer substrate ML are made by means of bumps for example. But any appropriate technology is possible for mounting the devices comprising switching unit SW and integrated circuit IC.

The multilayer substrate ML comprises a multitude of dielectric layers, each made of ceramic or a laminate. Arranged between each two dielectric layers is a metallization plane including a metallization structured to form conductor lines, electrical connections, and metallization areas being part of passive circuit elements like resistors, inductors or capacitors. Electric conductive connections between different metallization planes are made by through-contacts. At the bottom surface which is a surface of the layer facing away from the surface with the mounted components are electrical contact pads CP to connect the amplifier module to an external environment, for example to a printed circuit board PCB.

To mechanically protect the module from impacts from the environment and to seal the module an encapsulation can complete the module. This can be done by mounting a cover on top of the substrate thereby encompassing all semiconductor devices under the cover in a clearance of the cover. This cover can comprise a metallic sheet. A rigid cover made of ceramic is also possible. Further, it is possible to cover the devices on top of the substrate with a mold C as shown in FIG. 7, e.g. a glob top resin or an injection mold.

Some examples of the invention have been described; however, other examples are within the scope of the following claims.

What is claimed is:

1. An amplifier module comprising:
an integrated circuit device comprising a first amplifier circuit electrically connected to a first input terminal, the first amplifier circuit comprising x (x≧2) first amplifier branches electrically connected to the first input terminal;
y (y≧2) first output terminals, each of the y first output terminals corresponding to a transmit frequency band;
a first switching unit to electrically connect one or more of the first amplifier branches to one of the first output terminals;
a multilayer substrate, the integrated circuit device and the first switching unit being mounted on the multilayer substrate; and
a second input terminal, a second amplifier circuit, second output terminals, and a second switching unit, the second amplifier circuit comprising second amplifier branches, the second switching unit to electrically connect one or more of the second amplifier branches to one of the second output terminals;
wherein the multilayer substrate comprises integrated passive matching elements that comprise parts of matching circuits;
wherein each of the first amplifier branches is to deliver a different power level at a corresponding first amplifier branch outputs;

wherein matching circuits are configured to match first amplifier branches to a load at the first output terminals;

wherein matching circuits are configured to match second amplifier branches to a load at a second output terminal; and wherein the first input terminal is configured to receive a signal of a first frequency range and the second input terminal is configured to receive a signal of a second frequency range that is different from the first frequency range.

2. An amplifier module comprising:

an integrated circuit device comprising a first amplifier circuit electrically connected to a first input terminal, the first amplifier circuit comprising x (x≧2) first amplifier branches electrically connected to the first input terminal;

y (y≧2) first output terminals, each of the y first output terminals corresponding to a transmit frequency band;

a first switching unit to electrically connect one or more of the first amplifier branches to one of the first output terminals; and a multilayer substrate, the integrated circuit device and the first switching unit being mounted on the multilayer substrate;

wherein the multilayer substrate comprises integrated passive matching elements that comprise parts of matching circuits;

wherein each of the first amplifier branches is to deliver a different power level at a corresponding first amplifier branch output;

wherein the matching circuits are configured to match first amplifier branches to a load at the first output terminals; and wherein the first switching unit comprises:
  a level switch to select a first amplifier branch having a desired power level; and
  a band switch to select a first output terminal assigned to a transmit frequency band;
    wherein the level switch and the band switch are electrically connected to a common connection point.

3. The amplifier module of claim 1 or claim 2, wherein at least one matching circuit comprises:

a first matching element integrated in the multilayer substrate; and a second matching element mounted on top of the multilayer substrate, wherein the second matching element comprises a discrete passive element.

4. The amplifier module of claim 3, wherein the second matching element is integrated into a semiconductor substrate of the integrated circuit.

5. The amplifier module of claim 1 or claim 2, wherein the first switching unit comprises a semiconductor device.

6. The amplifier module of claim 1 or claim 2, wherein the first switching unit comprises a micro electro mechanical system (MEMS) device.

7. The amplifier module of claim 1 or claim 2, wherein the first switching unit comprises switches.

8. The amplifier module of claim 7 wherein the switches form an xPyT type switch, where x represents a number of first amplifier branches electrically connected to the first switching unit and y represents a number of first output terminals electrically connected to the first switching unit.

9. The amplifier module of claim 1 or claim 2, wherein the matching circuits are electrically connected to corresponding amplifier branches and are configured to match each branch of an amplifier circuit to a same common output impedance at an output.

10. The amplifier module of claim 1 or claim 2, wherein the first switching unit is formed in a semiconductor substrate; and further comprising circuitry for driving the first amplifier circuit, the circuitry for driving the first amplifier circuit being formed in the semiconductor substrate.

11. An amplifier module comprising:

an integrated circuit device comprising a first amplifier circuit electrically connected to a first input terminal, the first amplifier circuit comprising x (x≧2) first amplifier branches electrically connected to the first input terminal;

y (y≧2) first output terminals, each of the y first output terminals corresponding to a transmit frequency band;

a first switching unit to electrically connect one or more of the first amplifier branches to one of the first output terminals;

a multilayer substrate, the integrated circuit device and the first switching unit being mounted on the multilayer substrate; and a voltage regulator to deliver different bias voltages or currents to the first amplifier circuit, the voltage regulator being formed in a same semiconductor substrate as the first switching unit;

wherein the multilayer substrate comprises integrated passive matching elements that comprise parts of matching circuits;

wherein each of the first amplifier branches is to deliver a different power level at a corresponding first amplifier branch output; and wherein the matching circuits are configured to match first amplifier branches to a load at the first output terminals.

12. An amplifier module comprising:

an integrated circuit device comprising a first amplifier circuit electrically connected to a first input terminal, the first amplifier circuit comprising x (x≧2) first amplifier branches electrically connected to the first input terminal;

y (y≧2) first output terminals, each of the y first output terminals corresponding to a transmit frequency band;

a first switching unit to electrically connect one or more of the first amplifier branches to one of the first output terminals; and a multilayer substrate, the integrated circuit device and the first switching unit being mounted on the multilayer substrate;

wherein the multilayer substrate comprises integrated passive matching elements that comprise parts of matching circuits;

wherein each of the first amplifier branches is to deliver a different power level at a corresponding first amplifier branch output;

wherein the matching circuits are configured to match first amplifier branches to a load at the first output terminals; and wherein, for a first amplifier branch electrically connected to the first input terminal, the first amplifier branch comprises:

a number of amplifier stages that are different from a number of amplifier stages in any other first amplifier branch electrically connected to the first input terminal;

wherein each of the amplifier stages comprises a semiconductor element manufactured from a same technology as others of the amplifier stages.

13. An amplifier module comprising:

an integrated circuit device comprising a first amplifier circuit electrically connected to a first input terminal, the first amplifier circuit comprising x (x≧2) first amplifier branches electrically connected to the first input terminal;

y (y≧2) first output terminals, each of the y first output terminals corresponding to a transmit frequency band;

a first switching unit to electrically connect one or more of the first amplifier branches to one of the first output terminals; and a multilayer substrate, the integrated circuit device and the first switching unit being mounted on the multilayer substrate;

wherein the multilayer substrate comprises integrated passive matching elements that comprise parts of matching circuits;

wherein each of the first amplifier branches is to deliver a different power level at a corresponding first amplifier branch output;

wherein the matching circuits are configured to match first amplifier branches to a load at the first output terminals; and wherein a first matching circuit is electrically connected between the first amplifier circuit and the first switching unit, and a second matching circuit is electrically connected between the first switching unit and an output terminal.

14. The amplifier module of claim 1 or claim 2, wherein the first amplifier circuit comprises transistors comprising gallium-based semiconductors.

15. The amplifier module of claim 1 or claim 2, wherein the y first output terminals comprise:

five or more output terminals assigned to five different frequency bands of a wideband code division multiple access wireless communication system.

16. The amplifier module of claim 1 or claim 2, wherein the multilayer substrate comprises high temperature co-fired ceramic, low temperature co-fired ceramic, or a laminated board comprising integrated passive elements.

17. The amplifier module of claim 1 or claim 2, further comprising:

a molded cover over the multilayer substrate to cover one or more of the integrated circuit device, the first switching unit, and discrete passive components mounted on top of the multilayer substrate.

18. The amplifier module of claim 1 or claim 2, further comprising:

a cover comprising a metallic sheet.

* * * * *

UNITED STATES PATENT AND TRADEMARK OFFICE
CERTIFICATE OF CORRECTION

PATENT NO. : 7,804,365 B2  
APPLICATION NO. : 12/266733  
DATED : September 28, 2010  
INVENTOR(S) : Christian Korden It is certified that error appears in the above-identified patent and that said Letters Patent is hereby corrected as shown below:

On the title page, item [56]; Column 2, Line 1  
Delete "Database" and Insert --Datasheet--

Column 8, Claim 1, Line 67  
Delete "outputs;" and Insert --output;--

Signed and Sealed this  
First Day of March, 2011

David J. Kappos  
*Director of the United States Patent and Trademark Office*